United States Patent
Shi et al.

(10) Patent No.: US 12,210,048 B2
(45) Date of Patent: Jan. 28, 2025

(54) RAPID DETECTION DEVICE FOR MULTI-CHANNEL SPORADIC TRANSIENT PARTIAL DISCHARGE

(71) Applicant: CHINA SOUTHERN POWER GRID TECHNOLOGY CO., LTD., Guangdong (CN)

(72) Inventors: Quan Shi, Guangdong (CN); Qifu Lu, Guangdong (CN); Longhua Tang, Guangdong (CN); Wang Ran, Guangdong (CN); Ming Fu, Guangdong (CN); Dong Fu, Guangdong (CN); Wei Deng, Guangdong (CN)

(73) Assignee: CHINA SOUTHERN POWER GRID TECHNOLOGY CO., LTD., Guangdong (CN)

( * ) Notice: Subject to any disclaimer, the term of this patent is extended or adjusted under 35 U.S.C. 154(b) by 45 days.

(21) Appl. No.: 18/039,219

(22) PCT Filed: Dec. 6, 2021

(86) PCT No.: PCT/CN2021/135664
§ 371 (c)(1),
(2) Date: May 26, 2023

(87) PCT Pub. No.: WO2022/127633
PCT Pub. Date: Jun. 23, 2022

(65) Prior Publication Data
US 2024/0003958 A1    Jan. 4, 2024

(30) Foreign Application Priority Data

Dec. 16, 2020    (CN) .......................... 202011487015.7

(51) Int. Cl.
*G01R 31/12* (2020.01)

(52) U.S. Cl.
CPC .................. *G01R 31/1227* (2013.01)

(58) Field of Classification Search
CPC ........ G01R 31/11; G01R 31/12; G01R 31/14; G01R 31/1209; G01R 31/1218;
(Continued)

(56) References Cited

U.S. PATENT DOCUMENTS 5,475,312 A    12/1995  Sedding et al.
6,128,169 A *  10/2000  Neiger .................. H02H 3/334
                                                   324/520
(Continued)

FOREIGN PATENT DOCUMENTS

CN    101458291 A    6/2009
CN    101556302 A    10/2009
(Continued)

OTHER PUBLICATIONS

International Search Report for PCT/CN2021/135664 mailed Jan. 30, 2022, ISA/CN.
(Continued)

*Primary Examiner* — Thang X Le
(74) *Attorney, Agent, or Firm* — Yue (Robert) Xu; Apex Attorneys at Law, LLP

(57) ABSTRACT

A rapid detection device for multi-channel sporadic transient partial discharge, comprising a CPU and several partial discharge detection circuits. The partial discharge detection circuits are connected to a plurality of ports of the CPU one to one, respectively. First, a partial discharge pulse signal is filtered and amplified by means of a partial discharge pulse signal processing module in the partial discharge detection circuits, and is then inputted to a comparator, and a reference voltage passes through the CPU and is sent to a reference voltage processing module for amplification, filtering and other processing, and then is inputted to the comparator, so
(Continued)

that the comparator processes same according to the partial discharge pulse signal and the reference voltage and then inputs same to a trigger. Finally, according to a level signal at an output terminal of the trigger, the CPU determines whether partial discharge occurs in a circuit to be detected. The detection device of the present application is simple in structure and low-cost. Moreover, the detection device may continuously and quickly detect sporadic transient partial discharge signals without missing detection, thereby solving the technical problems in the prior art of easily missed detection and high costs.

10 Claims, 3 Drawing Sheets

(58) Field of Classification Search
CPC .......... G01R 31/1227; G01R 31/1272; G01R 31/1245; G01R 31/1254; G01R 31/1263; G01R 31/081; G01R 31/083; G01R 31/52; G01R 31/58; G01R 31/62
See application file for complete search history.

(56) References Cited

U.S. PATENT DOCUMENTS

| | | | |
|---|---|---|---|
| 9,372,221 | B1 | 6/2016 | Bierman |
| 10,962,584 | B2* | 3/2021 | Candela ................. G01R 31/08 |
| 11,942,774 | B2* | 3/2024 | Dichler ................. H02H 1/0015 |
| 2021/0190839 | A1* | 6/2021 | Lim ..................... G01R 23/165 |

FOREIGN PATENT DOCUMENTS

| | | |
|---|---|---|
| CN | 101750573 A | 6/2010 |
| CN | 101819246 A | 9/2010 |
| CN | 103197206 A | 7/2013 |
| CN | 204832421 U | 12/2015 |
| CN | 105527549 A | 4/2016 |
| CN | 205450180 U | 8/2016 |
| CN | 106324445 A | 1/2017 |
| CN | 107797033 A | 3/2018 |
| CN | 207123590 U | 3/2018 |
| CN | 208283506 U | 12/2018 |
| CN | 208314124 U | 1/2019 |
| CN | 110196380 A | 9/2019 |
| CN | 210090605 U | 2/2020 |
| CN | 112485623 A | 3/2021 |
| EP | 3447508 A1 | 2/2019 |

OTHER PUBLICATIONS

Chen Siqi, et al., A Design of Partial Discharge Detection Equipment for Switchgear, Cyber Security and Data Governance, Microcomputer & Its Applications, May 31, 2017, vol. 36 No. 9.

He, Wei, et al., Design of Multi-channel Partial Discharge Detection System Based on ARM and FPGA, Computer & Digital Engineering, Jan. 31, 2013, vol. 41 No. 1.

Zhu, Shenglong, et al., Design of Online Monitoring System for Partial Discharge of Intrusive Switchgear Based on Multi-channel Detection Technology, Electrical Applications, Jun. 30, 2015.

* cited by examiner

RAPID DETECTION DEVICE FOR MULTI-CHANNEL SPORADIC TRANSIENT PARTIAL DISCHARGE

The present application is a national stage of International Application No. PCT/CN2021/135664, filed on Dec. 6, 2021, which claims priority to Chinese Patent Application No. 202011487015.7, titled "RAPID DETECTION DEVICE FOR MULTI-CHANNEL SPORADIC TRANSIENT PARTIAL DISCHARGE", filed on Dec. 16, 2020 with the Chinese Patent Office, both of which are incorporated herein by reference in their entireties.

FIELD

The present disclosure relates to the technical field of electric power detection, and in particular, to a rapid detection device for multi-channel sporadic transient partial discharge.

BACKGROUND

In recent years, with the diversification, the miniaturization and the improvement of voltage level of high-voltage power equipment, operating failures of the power equipment have increased year by year. Traditionally, an interruption maintenance is periodically performed on the power equipment, in which a problem of "treating minor diseases in a big way, and treating all diseases even without any disease" exists. In addition, with the rapid expansion of power grid in scale, the workload of periodical interruption maintenance has increased sharply, and the shortage of maintenance personnel and the difficulty in arranging a power outage have become increasingly prominent. Therefore, the traditional manner of periodical interruption maintenance is more and more difficult to adapt to the requirements for development of the power grid.

In order to overcome the above problems, the power equipment is currently maintained by using live line partial discharge detection technology, which can effectively avoid various problems caused by the power outage. The live line partial discharge detection technology mainly includes methods, such as, transient voltage-to-ground detection, ultrasonic detection, high-frequency current detection, ultra high-frequency current detection. These detection methods are required to be performed by combining with a partial discharge detection device, to acquire and detect partial discharge signals in an intermittent acquisition manner or a continuous acquisition manner. However, for the partial discharge detection device in the intermittent acquisition manner, some partial discharge signals may be missed due to the characteristics of the partial discharge signals. For the partial discharge detection device in the continuous acquisition manner, a sampling frequency of 3 GHz is required due to the high frequency and transient characteristic and other characteristics of the partial discharge signals. The partial discharge detection device in the continuous acquisition manner is generally realized by means of high-speed oscilloscopes and high-speed acquisition cards with a high cost.

Therefore, there is an urgent need in the art to provide a partial discharge detection device with a low cost and in which no partial discharge signal is missed.

SUMMARY

The objective of the present disclosure is to provide a rapid detection device for multi-channel sporadic transient partial discharge, which is used to solve the technical problems of easy missing the partial discharge signal and high cost in the conventional technology.

In view of this, a rapid detection device for multi-channel sporadic transient partial discharge is provided according to the present disclosure. The device includes: a CPU and multiple partial discharge detection circuits.

Each of the partial discharge detection circuits includes an input terminal configured to receive a partial discharge pulse signal, and an output terminal (Q) connected to an input terminal of the CPU.

Each of the partial discharge detection circuits includes: a partial discharge pulse signal processing module, a reference voltage processing module, a comparator (U2), and a trigger (U3).

The partial discharge pulse signal processing module is connected to an input terminal (A) of the comparator (U2), the reference voltage processing module is connected to an input terminal (B) of the comparator (U2), and an output terminal (Y) of the comparator (U2) is connected to an input terminal (CP) of the trigger (U3).

The partial discharge pulse signal processing module is configured to sequentially perform voltage amplitude limit protection, impedance matching, band-pass filtering, amplification and filtering on the partial discharge pulse signal; and the reference voltage processing module is configured to sequentially perform conversion, amplification and filtering on a reference voltage.

The comparator (U2) is configured to compare a processed partial discharge pulse signal with a processed reference voltage, and output a first level signal to the trigger (U3).

The trigger (U3) is configured to process and lock the level signal, and transmit a second level signal to an input terminal of the CPU through the output terminal (Q).

A terminal (CLR) of the trigger (U3) is connected to a first output terminal of the CPU, is configured to receive a pulse signal from a first input terminal of the CPU in response to the second level signal received by the input terminal of the CPU, and the output terminal (Q) of the trigger (U3) is restored to an initial level in response to the pulse signal.

Optionally, the partial discharge pulse signal processing module includes: a diode (D1), an impedance matching resistor (R1), a band-pass filter, an impedance matching resistor (R2), a resistor (RG1), an amplifier (U1) and a first filter circuit.

The diode (D1) includes two terminals respectively connected to a terminal (IN+) and an input terminal (IN−), the impedance matching resistor (R1) includes two terminals respectively connected to two terminals of the diode (D1), the band-pass filter is connected in parallel with the impedance matching resistor (R1), the impedance matching resistor (R2) includes two terminals respectively connected to two terminals of the band-pass filter, the amplifier includes two input terminals respectively connected to two terminals of the impedance matching resistor (R2) and an output terminal (OUT) connected to a first end of the first filter circuit, a second terminal of the first filter circuit is connected to the input terminal (A) of the comparator (U2), and the resistor (RG1) is connected in parallel between two input terminals of the amplifier.

Optionally, the band-pass filter includes: a capacitor (C1), a capacitor (C2) and an inductor (L1);

Two terminals of the capacitor (C1) are respectively connected to two terminals of the impedance matching resistor (R1), one terminal of the inductor (L1) is connected to one terminal of the capacitor (C1), and the other terminal of the inductor (L1) is connected to one terminal of the capacitor (C2), the other terminal of the capacitor (C2) is connected to the other terminal of the capacitor (C1), and two terminals of the impedance matching resistor (R2) are respectively connected to two terminals of the capacitor (C2).

Optionally, the first filter circuit includes: a resistor (R3), a resistor (R4) and a capacitor (C3).

The resistor (R3) includes one terminal connected to the output terminal (OUT) of the amplifier, and the other terminal connected to one terminal of the resistor (R4), one terminal of the capacitor (C3) and the input terminal (A) of the comparator (U2).

The other terminal of the resistor (R4) and the other terminal of the capacitor (C3) are both grounded.

Optionally, the reference voltage processing module includes: a converter circuit (U5), an amplifier circuit, and a second filter circuit.

An input terminal of the converter circuit (U5) is connected to a second output terminal of the CPU, and is configured to receive the reference voltage from the second output terminal of the CPU; and an output terminal of the converter circuit (U5) is connected to a first terminal of the amplifier circuit, an output terminal of the amplifier is connected to a first terminal of the second filter circuit, and a second terminal of the second filter circuit is connected to the input terminal (B) of the comparator (U2).

Optionally, the amplifier circuit includes: a resistor (R6), a resistor (R7), a resistor (R8), and an amplifier (U4).

The resistor (R6) includes one terminal connected to the output terminal of the converter circuit (U5) and the other end connected to a first input terminal of the amplifier (U4); a second input terminal of the amplifier (U4) is connected to one terminal of the resistor (R7) and one terminal of the resistor (R8); the other terminal of the resistor (R8) is grounded; the other terminal of the resistor (R7) is connected to an output terminal of the amplifier (U4); and the output terminal of the amplifier (U4) is connected to the second filter circuit.

Optionally, the second filter circuit includes: a capacitor (C4), a resistor (R5), and a resistor (R6).

The resistor (R5) includes one terminal connected to the output terminal of the amplifier (U4) and the other end connected to one terminal of the resistor (R6), one terminal of the capacitor (C4) and the input terminal (B) of the comparator (U2).

The other terminal of the resistor (R6) and the other terminal of the capacitor (C4) are both grounded.

Optionally, the rapid detection device for multi-channel sporadic transient partial discharge further includes: a touch display.

The touch display is electrically connected to the CPU, and is configured to display a detection pattern or detection data of the partial discharge pulse signal processed by each of the partial discharge detection circuits, where the detection pattern includes a trend pattern, a phase pattern, a PRPD pattern, or a PRPS pattern.

Optionally, the rapid detection device for multi-channel sporadic transient partial discharge further includes: a data storage device.

The data storage device is electrically connected to the CPU, and is configured to store the detection pattern or the detection data.

Optionally, the rapid detection device for multi-channel sporadic transient partial discharge further includes: a keyboard, a Bluetooth communication module and a power supply.

The keyboard is electrically connected to the CPU, and is configured to input a control instruction; the Bluetooth communication module is electrically connected to the CPU, and is configured to transmit the detection pattern or the detection data; and the power supply is configured to supply power for the rapid detection device for multi-channel sporadic transient partial discharge.

Compared with the conventional technology, the embodiments of the present disclosure have the following advantages.

A rapid detection device for multi-channel sporadic transient partial discharge is provided according to the present disclosure. The rapid detection device includes: a CPU and multiple partial discharge detection circuits. The multiple partial discharge detection circuits are respectively connected to multiple ports of the CPU. The number of the partial discharge detection circuits may be set by a user based on the number of circuits to be detected, such that all circuits to be detected are detected. First, the partial discharge pulse signal processing module in the partial discharge detection circuits performs some processes, such as, filtering and amplification, on the partial discharge pulse signal of the circuit to be detected. Then, the processed partial discharge pulse signal is inputted to the comparator. The reference voltage is transmitted to the reference voltage processing module by the CPU for processing and then the processed reference voltage is inputted to the comparator. The comparator performs a process based on the partial discharge pulse signal and the reference voltage, and outputs a signal to the trigger for processing. Finally, the CPU determines whether partial discharge occurs in the circuit to be detected based on a level signal from the output terminal of the trigger. The rapid detection device according to the present disclosure has a simple structure and low cost, and can continuously and rapidly detect sporadic transient partial discharge signals without missing, thereby solving the technical problems of easy missing the partial discharge signal and high cost in the conventional technology.

BRIEF DESCRIPTION OF THE DRAWINGS

In order to more clearly illustrate the technical solutions in the specific embodiments of the present disclosure or in the conventional technology, the accompanying drawings used in the description of the specific embodiments or the conventional technology will be briefly introduced hereinafter. Apparently, the accompanying drawings described hereafter illustrate some embodiments of the present disclosure. Other drawings can be obtained for those skilled in the art based on these drawings without any creative efforts.

DETAILED DESCRIPTION

The technical solutions according to the embodiments of the present disclosure will be described clearly and completely hereinafter with reference to the accompanying drawings. Apparently, the described embodiments are only part of the embodiments according to the present disclosure, rather than all of the embodiments. All other embodiments obtained by those skilled in the art based on the embodiments of the present disclosure without creative efforts fall within the protection scope of the present disclosure.

In the description of the present disclosure, it should be noted that the terms "first", "second" and "third" are only for illustrative purposes, and cannot be understood as indicating or implying relative importance.

Unless otherwise explicitly specified and defined, the terms "mounting", "link" and "connection" should be interpreted in a broad sense, for example, it may be a fixed connection, a detachable connection, or an integral connection; a mechanical connection or an electrical connection; a direct connection, an indirect connection through an intermediate medium, or an internal connection between two components. For those skilled in the art, the specific meaning of the above terms in the present disclosure may be understood in the light of specific circumstances.

Figure 1:
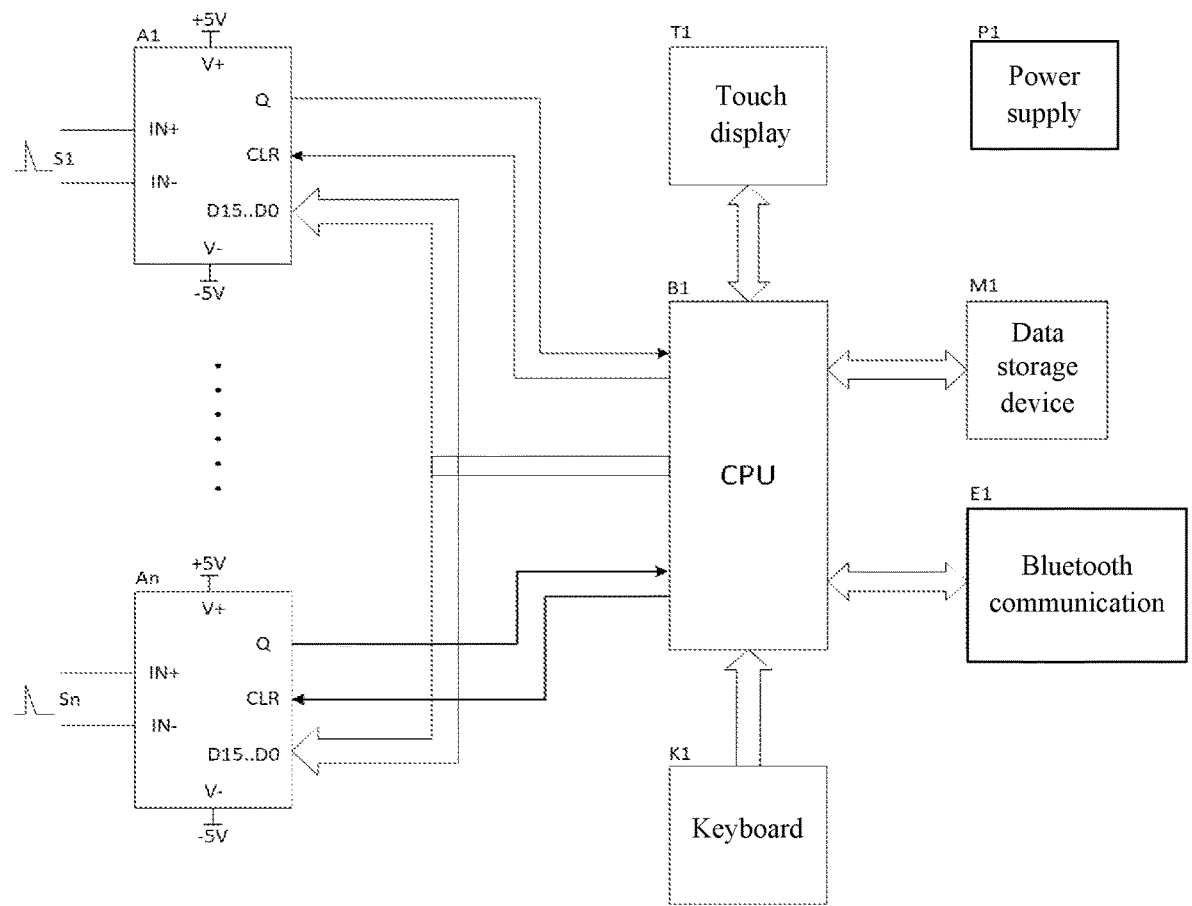
FIG. 1 is a schematic structural diagram of a rapid detection device for multi-channel sporadic transient partial discharge according to an embodiment of the present disclosure.
Figure 2:
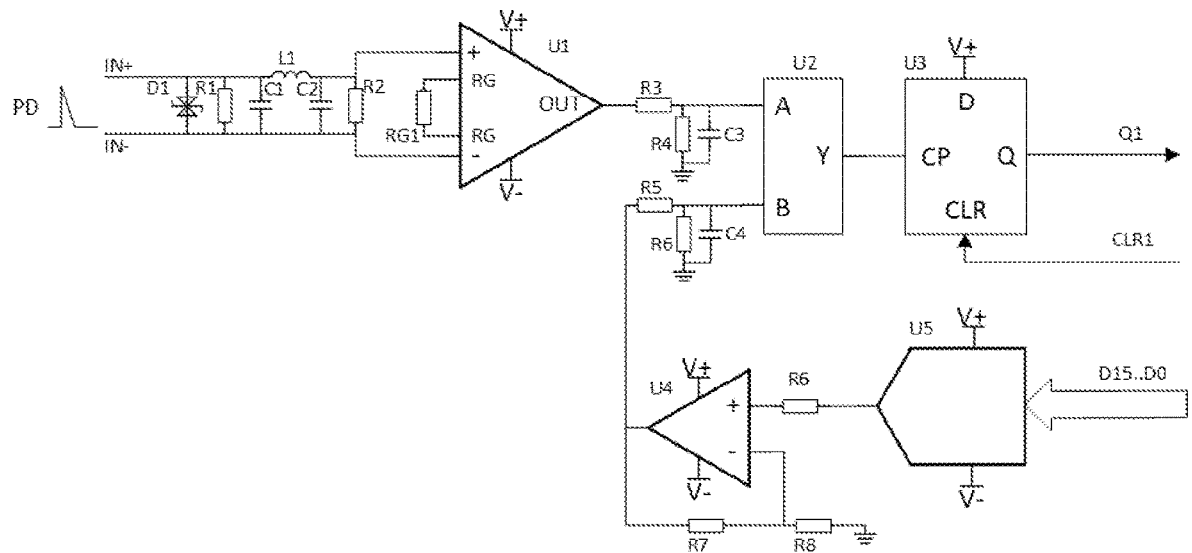
FIG. 2 is a schematic structural diagram of a partial discharge detection circuit according to an embodiment of the present disclosure.

Reference is made to FIG. 1 and FIG. 2, a rapid detection device for multi-channel sporadic transient partial discharge according to an embodiment of the present disclosure includes: a CPU and multiple partial discharge detection circuits.

Each of the partial discharge detection circuits includes an input terminal for receiving a partial discharge pulse signal, and an output terminal (Q) connected to an input terminal of the CPU. Each of the partial discharge detection circuits includes: a partial discharge pulse signal processing module, a reference voltage processing module, a comparator (U2), and a trigger (U3). The partial discharge pulse signal processing module is connected to an input terminal (A) of the comparator (U2). The reference voltage processing module is connected to an input terminal (B) of the comparator (U2). An output terminal (Y) of the comparator (U2) is connected to an input terminal (CP) of the trigger (U3).

Figure 4:
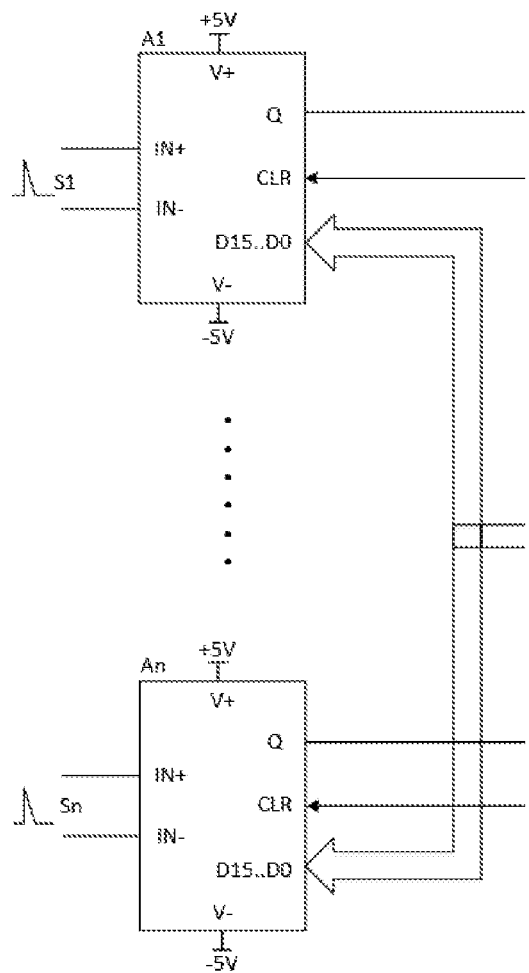
FIG. 4 is a schematic structural diagram of multiple partial discharge detection modules according to an embodiment of the present disclosure.

It should be noted that the number of partial discharge detection circuits may be set by a user based on the actual number of partial discharge pulse signals of circuits to be detected, as shown in FIG. 4.

The partial discharge pulse signal processing module is configured to sequentially perform voltage amplitude limit protection, impedance matching, band-pass filtering, amplification and filtering on the partial discharge pulse signal. The reference voltage processing module is configured to sequentially perform conversion, amplification and filtering on a reference voltage.

The comparator (U2) is configured to compare a processed partial discharge pulse signal with a processed reference voltage, and output a first level signal to the trigger (U3).

The trigger (U3) is configured to: process and lock the level signal, and transmit a second level signal to an input terminal of the CPU through the output terminal (Q).

A terminal (CLR) of the trigger (U3) is connected to a first output terminal of the CPU, which is configured to receive a pulse signal from a first input terminal of the CPU in response to the second level signal received by the input terminal of the CPU. The output terminal (Q) of the trigger (U3) is restored to an initial level in response to the pulse signal.

Referring to FIG. 2, the rapid detection device for multi-channel sporadic transient partial discharge according to the present disclosure operates in the following operating principle.

The CPU, outside the partial discharge detection circuits, controls a DA converter in the reference voltage processing module to output a reference voltage through data lines D15 . . . D0 of the DA converter. The reference voltage is adjusted and the adjusted reference voltage is inputted to the input terminal B of the comparator U2. A partial discharge pulse signal PD is adjusted by the partial discharge pulse signal processing module and the adjusted PD signal is inputted to the input terminal A of the comparator U2. When the amplitude of the PD signal is greater than that of the reference voltage, the output terminal Y of the comparator U2 outputs a high level. When the amplitude of the PD signal is less than that of the reference voltage, the output terminal Y of the comparator U2 outputs a low level. When the output of the output terminal Y of the comparator U2 changes from the low level to the high level, that is, a positive pulse is generated at the input terminal CP of the trigger U3, the output terminal Q of the trigger U3 outputs a high level. At this time, when the level of the output terminal Y of the comparator U2 changes, since the output state of the trigger U3 has been locked, the level of the output terminal Q of the trigger U3 does not change and is still the high level. The external CPU may determine a relationship between the amplitude of the partial discharge pulse signal PD and the amplitude of the reference voltage by reading the state of the level of the output terminal Q of the trigger U3. In this way, the partial discharge pulse signal is detected. In order to detect a next partial discharge pulse signal, the external CPU controls CLR1 to output a positive pulse to the CLR of the trigger U3, and sets the level of the output terminal Q of the trigger U3 to a low level, thereby releasing the locked state of the output terminal Q of the trigger U3.

A rapid detection device for multi-channel sporadic transient partial discharge is provided according to the present disclosure. The rapid detection device includes: a CPU and multiple partial discharge detection circuits. The multiple partial discharge detection circuits are respectively connected to multiple ports of the CPU. The number of the partial discharge detection circuits may be set by a user based on the number of circuits to be detected, such that all circuits to be detected are detected. First, the partial discharge pulse signal processing module in the partial discharge detection circuits performs some processes, such as, filtering and amplification, on the partial discharge pulse signal of the circuit to be detected. Then, the processed partial discharge pulse signal is inputted to the comparator. The reference voltage is transmitted to the reference voltage processing module by the CPU for processing and then the processed reference voltage is inputted to the comparator. The comparator performs a process based on the partial discharge pulse signal and the reference voltage, and outputs a signal to the trigger for processing. Finally, the CPU determines whether partial discharge occurs in the circuit to be detected based on a level signal from the output terminal of the trigger. The rapid detection device according to the present disclosure has a simple structure and low cost, and can continuously and rapidly detect sporadic transient partial discharge signals without missing, thereby solving the technical problems of easy missing the partial discharge signal and high cost in the conventional technology.

Further, in a specific embodiment, the partial discharge pulse signal processing module includes: a diode (D1), an impedance matching resistor (R1), a band-pass filter, an impedance matching resistor (R2), a resistor (RG1), an amplifier (U1) and a first filter circuit. The diode (D1) includes two terminals respectively connected to a terminal (IN+) and an input terminal (IN−). The impedance matching resistor (R1) includes two terminals respectively connected to two terminals of the diode (D1). The band-pass filter is connected in parallel with the impedance matching resistor (R1). The impedance matching resistor (R2) includes two terminals respectively connected to two terminals of the band-pass filter. Two input terminals of the amplifier are respectively connected to two terminals of the impedance matching resistor (R2). An output terminal (OUT) of the amplifier is connected to a first terminal of the first filter circuit. A second terminal of the first filter circuit is connected to the input terminal (A) of the comparator (U2). The resistor (RG1) is connected in parallel between two input terminals of the amplifier.

It should be noted that an amplitude limit protection is performed on the partial discharge pulse signal PD by a transient voltage protection diode D1, to prevent a high voltage signal from entering and damaging the detection circuit. The resistor R1 is an impedance matching resistor for a sensor, by which the partial discharge pulse signal PD may be introduced into the detection circuit without attenuation. The band-pass filter has a band-pass range of 3 MHz to 1.5 GHz, which filters out power frequency interference signals and other narrow-band interference signals, and increases the anti-interference ability of the detection circuit. The resistor R2 is an impedance matching resistor for a filter, by which the filtered signal may be transmitted to a post-amplifier circuit without attenuation. U1 is a high-speed and high-precision instrumentation amplifier, which may amplify weak signals and high-frequency signals. The resistance (RG1) is used to adjust an output gain of the instrumentation amplifier. The first filter circuit is used to filter an output signal of the instrumentation amplifier to improve the anti-interference ability of the detection circuit.

Further, in a specific embodiment, the band-pass filter includes: a capacitor (C1), a capacitor (C2) and an inductor (L1).

Two terminals of the capacitor (C1) are receptively connected to two terminals of the impedance matching resistor (R1). The inductor (L1) includes one terminal connected to one terminal of the capacitor (C1), and the other terminal connected to one terminal of the capacitor (C2). The other terminal of the capacitor (C2) is connected to the other terminal of the capacitor (C1). Two terminals of the impedance matching resistor (R2) are respectively connected to two terminals of the capacitor (C2).

Further, in a specific embodiment, the first filter circuit includes: a resistor (R3), a resistor (R4) and a capacitor (C3).

The resistor (R3) includes one terminal connected to the output terminal (OUT) of the amplifier, and the other terminal connected to one terminal of the resistor (R4), one terminal of the capacitor (C3) and the input terminal (A) of the comparator (U2).

The other terminal of the resistor (R4) and the other terminal of the capacitor (C3) are both grounded.

In a specific embodiment, the reference voltage processing module includes: a converter circuit (U5), an amplifier circuit, and a second filter circuit. An input terminal of the converter circuit (U5) is connected to a second output terminal of the CPU, which is configured to receive the reference voltage from the second output terminal of the CPU. An output terminal of the converter circuit (U5) is connected to a first terminal of the amplifier circuit. An output terminal of the amplifier is connected to a first terminal of the second filter circuit. A second terminal of the second filter circuit is connected to the input terminal (B) of the comparator (U2).

It should be noted that U5 is a high-speed DA converter circuit, and the input terminal of U5 is connected to a 16-bit data signal (reference voltage) of the CPU. The amplifier circuit is used to amplify the output signal of the DA converter circuit U5. The second filter circuit is used to filter the output signal of the amplifier circuit, to improve the anti-interference ability of the detection circuit.

Further, in a specific embodiment, the amplifier circuit includes: a resistor (R6), a resistor (R7), a resistor (R8), and an amplifier (U4).

The resistor (R6) includes one terminal connected to the output terminal of the converter circuit (U5), and the other end connected to a first input terminal of the amplifier (U4). A second input terminal of the amplifier (U4) is connected to one terminal of the resistor (R7) and one terminal of the resistor (R8). The other terminal of the resistor (R8) is grounded. The other terminal of the resistor (R7) is connected to an output terminal of the amplifier (U4). The output terminal of the amplifier (U4) is connected to the second filter circuit.

In a specific embodiment, the second filter circuit includes: a capacitor (C4), a resistor (R5), and a resistor (R6). The resistor (R5) includes one terminal connected to the output terminal of the amplifier (U4), and the other end connected to one terminal of the resistor (R6), one terminal of the capacitor (C4) and the input terminal (B) of the comparator (U2). The other terminal of the resistor (R6) and the other terminal of the capacitor (C4) are both grounded.

Figure 3:
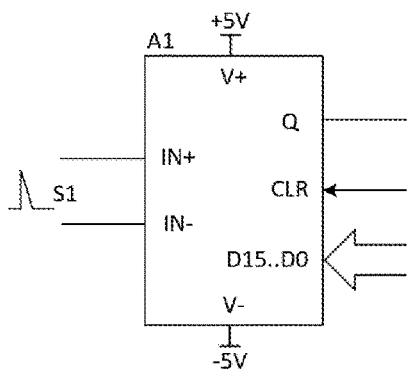
FIG. 3 is a schematic structural diagram of an encapsulated module of a partial discharge detection circuit according to an embodiment of the present disclosure.

It should be noted that the partial discharge detection circuit according to the present disclosure may be encapsulated as a detection module. As shown in FIG. 3, the input terminal includes: IN+, IN−, D15 . . . D0 (the input terminal of the converter circuit U5), CLR; the output terminal includes Q; and power supply V+, V−. Multiple partial discharge detection circuits may share one data line, that is, one output port of the CPU may be connected to the input terminals of multiple partial discharge detection circuits U5, as shown in FIG. 4.

Further, the rapid detection device for multi-channel sporadic transient partial discharge according to the present disclosure further includes a touch display. The touch display is electrically connected to the CPU, and is configured to display a detection pattern or detection data of the partial discharge pulse signal processed by each of the partial discharge detection circuits, where the detection pattern includes a trend pattern, a phase pattern, a PRPD pattern, or a PRPS pattern.

Further, the rapid detection device for multi-channel sporadic transient partial discharge according to the present disclosure further includes: a data storage device electrically connected to the CPU, and configured to store the detection pattern or the detection data.

Further, the rapid detection device for multi-channel sporadic transient partial discharge according to the present disclosure further includes: a keyboard, a Bluetooth communication module and a power supply. The keyboard is electrically connected to the CPU and is configured to input a control instruction. The Bluetooth communication module is electrically connected to the CPU, and is configured to transmit the detection pattern or detection data. The power supply is configured to supply power for the rapid detection device for multi-channel sporadic transient partial discharge.

It should be understood that, in the present disclosure, the term "at least one" refers to a quantity equal to one or more, and the term "multiple" refers to a quantity equal to two or more. The term "and/or" is used to describe an association relationship between associated objects, and indicates three possible relationships, for example, "A and/or B" may indicate a case that there is only A, a case that there is only B, and a case that there are both A and B. In each case, a quantity of A may be one or more, and a quantity of B may be one or more. The symbol "/" generally indicates that a former object and a latter object are associated by an "or" relationship. The term "at least one of" or similar expressions thereof refer to "any combination of", including any combination consisting of a single item or multiple items. For example, at least one of a, b or c may indicate: a, b, c, "a and b", "a and c", "b and c", or "a and b and c", where a, b, c may be singular or plural.

Finally, it should be noted that the above embodiments are only intended to describe the technical solutions of the present disclosure, but not to limit the scope of the present disclosure. Although the present disclosure is described in detail with reference to the above embodiments, it should be understood by those skilled in the art that modifications can be made to the technical solutions recorded in the above embodiments or equivalent replacements can be made to some or all of the technical features thereof, which modifications and equivalent replacements will not make the corresponding technical solutions deviate from the scope of the technical solutions of the embodiments of the present disclosure.

The invention claimed is:

1. A rapid detection device for multi-channel sporadic transient partial discharge, comprising:
   a CPU and a plurality of partial discharge detection circuits;
   wherein each of the partial discharge detection circuits comprises an input terminal configured to receive a partial discharge pulse signal, and an output terminal connected to an input terminal of the CPU;
   each of the partial discharge detection circuits comprises: a partial discharge pulse signal processing module, a reference voltage processing module, a comparator, and a trigger;
   the partial discharge pulse signal processing module is connected to a first input terminal of the comparator, the reference voltage processing module is connected to a second input terminal of the comparator and an output terminal of the comparator is connected to an input terminal of the trigger;
   the partial discharge pulse signal processing module is configured to sequentially perform voltage amplitude limit protection, impedance matching, band-pass filtering, amplification and filtering on the partial discharge pulse signal; and the reference voltage processing module is configured to sequentially perform conversion, amplification and filtering on a reference voltage;
   the comparator is configured to compare a processed partial discharge pulse signal with a processed reference voltage, and output a first level signal to the trigger
   the trigger is configured to process and lock a level signal, and transmit a second level signal to an input terminal of the CPU through an output terminal of the trigger; and
   a control terminal of the trigger is connected to a first output terminal of the CPU, and is configured to receive a pulse signal from the first output terminal of the CPU in response to the second level signal received by the input terminal of the CPU, and the output terminal of the trigger is restored to an initial level in response to the pulse signal.

2. The rapid detection device for multi-channel sporadic transient partial discharge according to claim 1, wherein the partial discharge pulse signal processing module comprises: a diode, a first impedance matching resistor, a band-pass filter, a second impedance matching resistor, a first resistor, an amplifier and a first filter circuit,
   the diode comprises two terminals respectively connected to a positive input terminal and a negative input terminal, the first impedance matching resistor comprises two terminals respectively connected to two terminals of the diode, the band-pass filter is connected in parallel with the first impedance matching resistor, two terminals of the impedance matching resistor are respectively connected to two terminals of the band-pass filter, two input terminals of the amplifier are respectively connected to two terminals of the second impedance matching resistor, an output terminal of the amplifier is connected to a first terminal of the first filter circuit, a second terminal of the first filter circuit is connected to the first input terminal of the comparator, and the first resistor is connected in parallel between two input terminals of the amplifier.

3. The rapid detection device for multi-channel sporadic transient partial discharge according to claim 2, wherein the band-pass filter comprises: a first capacitor, a second capacitor and an inductor;
   two terminals of the first capacitor are respectively connected to two terminals of the first impedance matching resistor, a first terminal of the inductor is connected to a first terminal of the first capacitor, and a second terminal of the inductor is connected to a first terminal of the second capacitor, a second terminal of the second capacitor is connected to a second terminal of the first capacitor, and two terminals of the second impedance matching resistor are respectively connected to the first terminal and the second terminal of the second capacitor.

4. The rapid detection device for multi-channel sporadic transient partial discharge according to claim 3, wherein the first filter circuit comprises: a second resistor, a third resistor and a third capacitor;
   the second resistor comprises a first terminal connected to the output terminal of the amplifier; and a second terminal connected to a first terminal of the third resistor, a first terminal of the third capacitor and the first input terminal of the comparator; and
   the other a second terminal of the third resistor and a second terminal of the third capacitor are both grounded.

5. The rapid detection device for multi-channel sporadic transient partial discharge according to claim 1, wherein the reference voltage processing module comprises: a converter circuit, an amplifier circuit, and a second filter circuit;
   an input terminal of the converter circuit is connected to a second output terminal of the CPU and is configured to receive the reference voltage from the second output terminal of the CPU, and an output terminal of the converter circuit is connected to a first terminal of the amplifier circuit, an output terminal of the amplifier circuit is connected to a first terminal of the second filter circuit, and a second terminal of the second filter circuit is connected to the second input terminal of the comparator.

6. The rapid detection device for multi-channel sporadic transient partial discharge according to claim 5, wherein the amplifier circuit comprises: a first amplifier resistor, a second amplifier resistor, a third amplifier resistor, and an amplifier;
    the first amplifier resistor comprises a first terminal connected to the output terminal of the converter circuit, and a second terminal connected to a first input terminal of the amplifier; a second input terminal of the amplifier is connected to a first terminal of the second amplifier resistor and a first terminal of the third amplifier resistor; a second terminal of the third amplifier resistor is grounded; a second terminal of the second amplifier resistor is connected to an output terminal of the amplifier, and the output terminal of the amplifier is connected to the second filter circuit.

7. The rapid detection device for multi-channel sporadic transient partial discharge according to claim 6, wherein the second filter circuit comprises: a capacitor, a first filter resistor, and a second filter resistor;
    the first filter resistor comprises a first terminal connected to the output terminal of the amplifier, and a second terminal connected to one terminal of the second filter resistor, a first terminal of the capacitor and the second input terminal of the comparator; and
    a second terminal of the second filter resistor and a second terminal of the capacitor are both grounded.

8. The rapid detection device for multi-channel sporadic transient partial discharge according to claim 1, further comprising: a touch display,
    wherein the touch display is electrically connected to the CPU, and is configured to display a detection pattern or detection data of the partial discharge pulse signal processed by each of the partial discharge detection circuits, wherein the detection pattern comprises a trend pattern, a phase pattern, a PRPD pattern, or a PRPS pattern.

9. The rapid detection device for multi-channel sporadic transient partial discharge according to claim 8, further comprising: a data storage device,
    wherein the data storage device is electrically connected to the CPU, and is configured to store the detection pattern or the detection data.

10. The rapid detection device for multi-channel sporadic transient partial discharge according to claim 9, further comprising: a keyboard, a Bluetooth communication module and a power supply,
    wherein the keyboard is electrically connected to the CPU and is configured to input a control instruction; the Bluetooth communication module is electrically connected to the CPU and is configured to transmit the detection pattern or the detection data; and the power supply is configured to supply power for the rapid detection device for multi-channel sporadic transient partial discharge.

* * * * *